(12) United States Patent
Baluswamy et al.

(10) Patent No.: US 6,432,591 B1
(45) Date of Patent: Aug. 13, 2002

(54) OVERLAY TARGET DESIGN METHOD WITH PITCH DETERMINATION TO MINIMIZE IMPACT OF LENS ABERRATIONS

(75) Inventors: Pary Baluswamy; Richard D. Holscher, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 72 days.

(21) Appl. No.: 09/649,907

(22) Filed: Aug. 30, 2000

(51) Int. Cl.$^7$ ............................ G03F 9/00; H01L 23/544
(52) U.S. Cl. .................. 430/22; 430/5; 430/30; 257/797
(58) Field of Search ................ 430/5, 22, 30; 257/797

(56) References Cited

U.S. PATENT DOCUMENTS 6,074,786 A * 6/2000 Chiang ..................... 430/5
6,331,369 B1 * 12/2001 Kawakubo et al. .......... 430/22

OTHER PUBLICATIONS

"Investigation of New Overlay Measurement Marks for Optical Lithography", Takashi Saito et al., *J. Vac., Sci., Technol. B*. 16(6), Nov./Dec. 1998; pp. 3415–3418.

* cited by examiner

*Primary Examiner*—Christopher G. Young
(74) *Attorney, Agent, or Firm*—Dickstein Shapiro Morin & Oshinsky, LLP (57) ABSTRACT

A method of designing an alignment target system to minimize lens aberrations is disclosed. A first layer alignment target's pitch is selected based on the minimum feature size of the circuit. The second layer alignment target's pitch is selected based on the diffraction pattern of the first layer's target and the illumination settings of the second layer. Displacement errors are minimized when the second layer target's $1^{st}$ diffraction order overlaps the first layer target's $0^{th}$ diffraction order.

19 Claims, 14 Drawing Sheets

OVERLAY TARGET DESIGN METHOD WITH PITCH DETERMINATION TO MINIMIZE IMPACT OF LENS ABERRATIONS

BACKGROUND OF THE INVENTION

The invention relates to an overlay target design method for semiconductor fabrication to minimize the impact of lens aberrations on target projection.

DESCRIPTION OF RELATED ART

Figure 1:
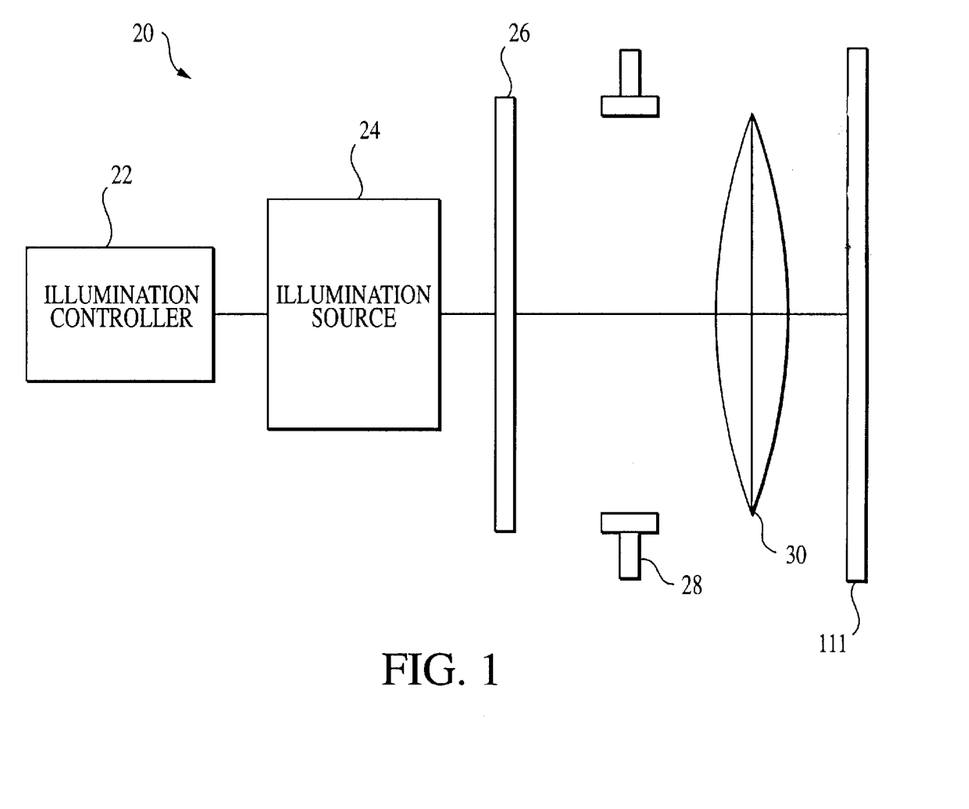
FIG. 1 is an illustration of a conventional optical imaging projection system.

Typically semiconductor devices are fabricated by optical lithography techniques using a projection imaging systems. A typical projection image system 20 is illustrated in FIG. 1. The system 20 at a minimum includes an illumination controller 22 and an illumination source 24 coupled with and controlled by controller 22. Illumination source 24 may include, for example, a mirror, a lamp, a light filter, and a condenser lens system. As used herein, the term "light" refers to light used in photolithography. The term "light" need not be restricted to visible light, but may also include other forms of radiation and lithography. For example, energy supplied by lasers, photons, ion beams, electron beams, or X-rays are included within the term "light".

Illumination source 24 emits light or radiation that can pass through openings in mask 26. System 20 shows mask 26 positioned adjacent to light source 24; optionally, other devices such as one or more optical lenses could separate light source 24 and mask 26. The term "mask" is not limited to a physical structure, but also includes a digitized image used in, for example, electron beam and ion beam lithography systems. For example, mask 26 may include a pattern for projecting a wiring or feature pattern of an integrated circuit. The pattern of mask 26 may include various image structures, for example, clear areas, opaque areas, phase shifting areas, and overlay targets. Mask 26 generally is a combination of clear areas and opaque areas, where the clear areas allow light from light source 24 to pass through mask 26 to form the mask's image. Light passing through mask 26 is further transmitted by projection lens 30, which may be, for example, a reduction lens or a combination of lenses for focusing the mask pattern onto a projection surface 111, such as a semiconductor wafer covered with a photoresist layer. Typical semiconductor fabrication involves a four to ten times reduction of mask size 26 by projection lens 30. Projection surface 111 is held in position by a holding device (not shown), which may be part of or controlled by a stepper (not shown). Also shown in FIG. 1 is lens pupil 28 of projection imaging lens 30, which defines the numerical aperture of lens 30.

Figure 2:
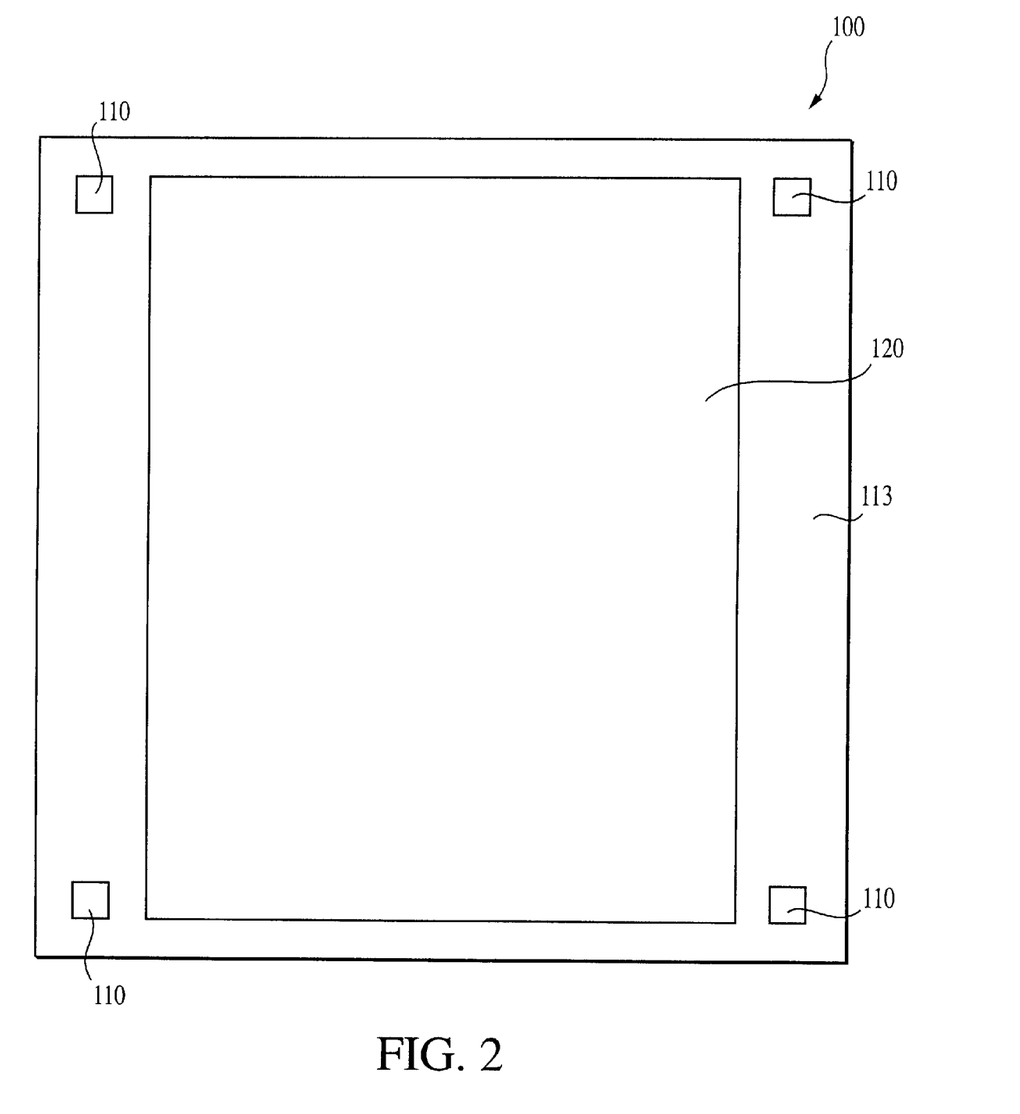
FIG. 2 is an illustration of conventional locations for electrical circuit patterns and alignment targets for an integrated circuit fabricated on a semiconductor substrate.

As the dimension of features on integrated circuits continue to decrease, the resolution limits of optical lithography are quickly being reached. One limit is caused by lens aberration, which is the failure of a lens, such as projection lens 30, to produce exact point-to-point correspondence between a received image, such as from mask 26, and a projection surface 111, such as a semiconductor die 100 a portion of which is illustrated in FIG. 2. One of the many types of lens aberrations in semiconductor device fabrication is coma aberrations which are optical aberrations that cause the image of a mask 26 to appear comet-shaped or blurred on die surface 113 (FIG. 2). Coma aberrations result in not only line width variations and/or pattern asymmetry, but also affect the location or placement of the mask image on the die surface 113. As discussed in Takashi Saito and Hisashi Watanabe's article "Investigation of New Overlay Measurement Marks for Optical Lithography," *J. Vac Sci Technol. B* 16(6), Nov/December 1998, pp. 3415, 3418, during submicron device fabrication using optical lithography lens aberrations cause different displacement errors for overlay targets and device patterns.

A target is a feature on a mask 26, usually at the perimeter of the mask 26, that is transferred to die surface 113 during the illumination phase. The target helps to determine if the image transfer from mask 26 to die surface 113 was properly aligned relative to lower layers. Typically, the quality of the lithographic image alignment is measured by determining the alignment of a target on a lower level to a target on an upper or overlay level. In general the image transfer is successful if the target of the upper-layer is approximately centered with the lower-level target. An overlay measurement system is used to measure the distances and spaces between edges or boundaries of the upper and lower targets. It is critically important that the circuit pattern on one layer is accurately aligned with that of earlier layers. To evaluate the alignment of two layers, a target is formed on each layer. FIG. 2 is an illustration of a single integrated circuit (IC) die 100 fabricated on a semiconductor wafer. The locations of the electrical circuit or pattern and targets are represented by large box 120, hereinafter referred to as pattern, and small boxes 110, hereinafter referred to as targets, respectively. Typical dimensions for die 100 are 5 millimeters by 5 millimeters and typical dimensions for targets 110 are 10 microns by 10 microns.

Figure 3:
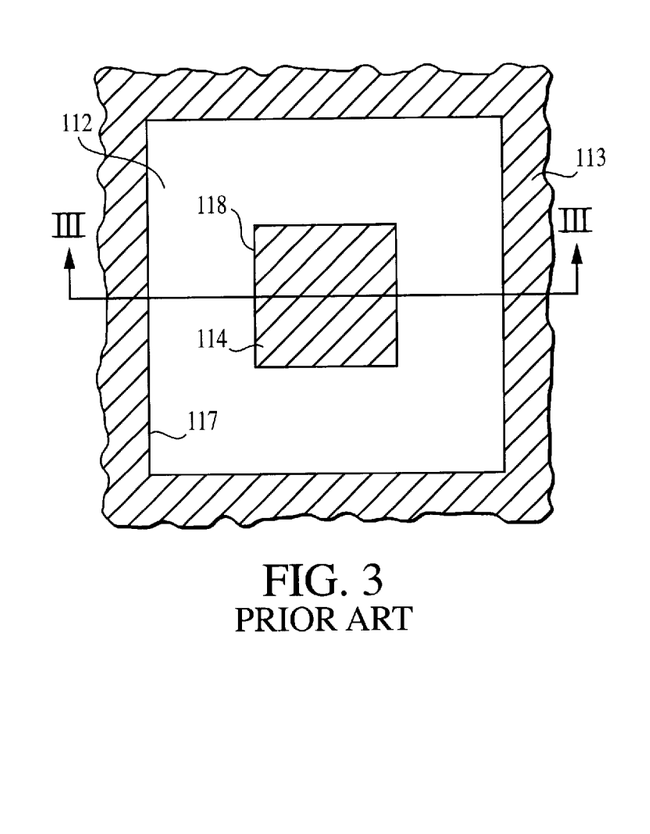
FIG. 3 is a top view of a conventional box-in box target system.
Figure 4:
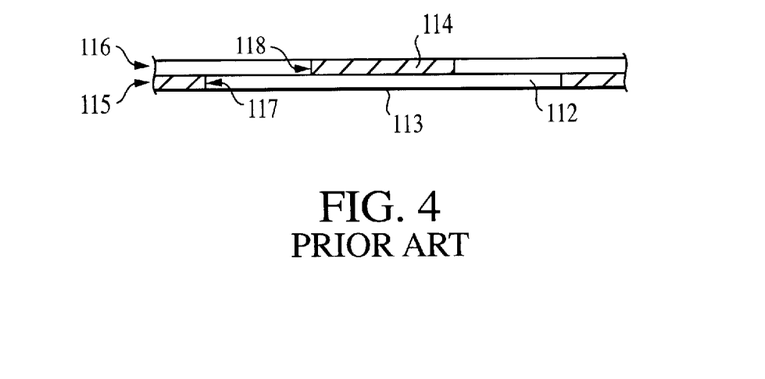
FIG. 4 is a cross-sectional view of FIG. 3 along line III—III.

A prior art method of mask alignment measurement will be described with respect to FIGS. 3 and 4. FIG. 3 is a top view of a prior art box-in-box target 110 of FIG. 2. FIG. 4 is a cross-sectional view of FIG. 3 along line III—III. The accuracy of the transfer of the targets 110 approximates the accuracy of the pattern 120 transfer. A first target 112 with a box pattern can be formed on surface 113 in a first layer or under layer 115 using well known lithography techniques. Typically, a silicon oxide material is deposited over first layer 115 to form a second layer 116. The second target 114 is formed in second layer 116 with dimensions smaller than target 112 using well known lithography techniques. The perimeter 117 of first target 112 and perimeter 118 of second target 114 can be viewed by optical measurement equipment. By measuring the distance between the two perimeters or isolated edges 117, 118 at several locations, the center positions of targets 112, 114 can be determined and positional deviations between the two targets 112, 114 can be determined. The overlay measurement provides a comparison of the alignment of the underlay target 112 of layer 115 with that of overlay target 114 of layer 116.

In the article by Saito and Watanabe the benefits of using fine pattern targets made up of thin lines instead of large box shaped patterns is discussed. Fine patterns targets, such as targets formed with thin line widths, are generally much closer to the actual circuit features dimensions than conventional large box patterns. Since lens aberrations typically induce line width variations and create alignment errors, using fine pattern targets allows more accurate detection of lens aberrations and alignment errors. In other words, the use of the typical box-in-box method (FIGS. 3–4) to determine mask 26 displacement errors is not very accurate for small device patterns, such as a quarter micron device fabrication (0.25 micron device feature size). Using targets with feature dimensions (size and pitch) similar to those of the circuit improves the detection of displacement errors.

Figure 5:
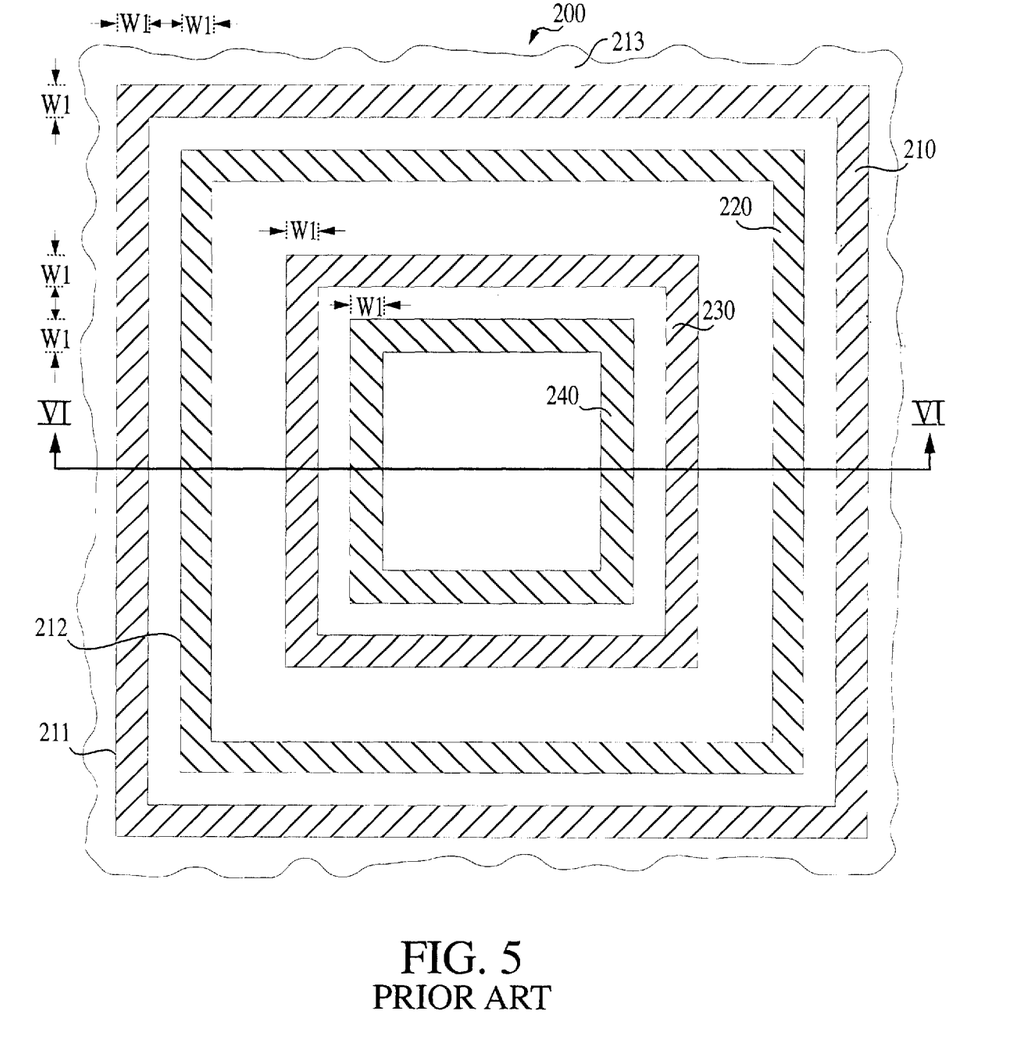
FIG. 5 is a top view of a conventional fine pattern target system.
Figure 6:
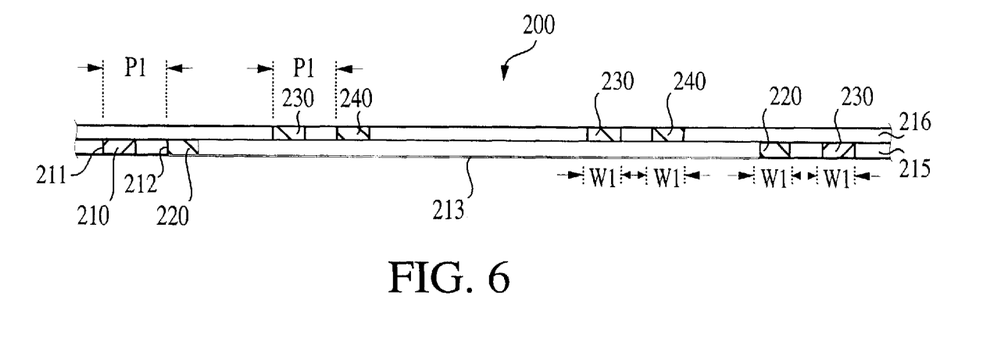
FIG. 6 is cross-sectional view of FIG. 5 along line VI—VI.

For example, FIG. 5 is an illustration of a conventional fine pattern target system 200. Fine pattern targets 210, 220 are formed in a first layer 215 (FIG. 6) over surface 213. Fine pattern targets 230, 240 are formed in a second layer 216 (FIG. 6) over first layer 215. FIG. 6 is a cross-sectional view of FIG. 5 along line VI—VI. In known target systems such as target system 200 (FIG. 5), the first layer targets 210, 220 and second layer targets 230, 240 generally have the same pitch (P1). The term "pitch" refers to the distance between the outside edge of a first target and the outside edge of a second target. For example in FIGS. 5–6, the pitch of targets 210 and 220 are the distance between the perimeter 211 of target 210 and the perimeter 212 of target 220. In known target systems 200 the pitches for targets in layers 215,216 are generally the same. In addition, target line widths (W1) are generally the same for targets in layers 215, 216. However even for targets in two different layers 215,216 with the same line width W1 and pitch P1, changes in the illumination settings of light source 24, such as wave length, intensity, and annular size, used to form the targets 210, 220, 230, 240 can cause misplacement of the second layer targets 230, 240 due to projection lens 30 aberrations.

Illumination settings are an important design factor for optimizing circuit feature dimensions, as the settings often change from one layer to another. For example, if the second layer 216 targets 230, 240 of FIGS. 5–6 are formed using different illumination settings than that used for first layer 215 targets 210, 220 the light will be diffracted differently by the mask 26. Since the target patterns have different diffraction patterns, light will enter and exit lens 30 (FIG. 1) at different locations. Due to normal variations in lens surfaces, if light passes through different locations, lens aberrations will cause the light to diffract differently causing target displacement in the second layer 216.

The displacement error is a function of the mechanical placement capability of the system 20 and the projection lens 30 aberrations. The mechanical displacement is the same for both the pattern 120 and targets 110. However, lens aberrations affect the pattern 120 and targets 110 differently. In most cases, the lens induced error for the pattern 120 is smaller than the lens induced error in typical box-in-box targets 110. The lens error is more pronounced when different illumination shapes are used on two different layers. Since the aberrations change across the lens 30 the light is subject to different aberration patterns. Hence corrections based on typical box-in-box targets 110 or fine targets using the same pitch at both levels will induce displacement errors into the pattern 120.

There is a need and desire for a new method of designing feature dimensions, such as the pitch of second layer alignment targets, to minimize the impact of lens aberrations. Moreover there is a need to maximize the lens region overlap of light diffracted from two different illumination shapes. Furthermore, there is a need and desire for a new method for determining the pitch of a second layer targets based on the pitch and light diffraction patterns of a first layer target that minimizes displacement of the second layer targets by lens aberrations due to changes in illumination settings.

SUMMARY OF THE INVENTION

The invention relates to a method of determining a dimension for a semiconductor feature, in particular a second layer alignment target's pitch, to minimize the impact of lens aberrations during optical projection. In an exemplary embodiment, the design method determines the pitch of a second layer fine pattern alignment target based on the light diffraction patterns of a first layer fine pattern alignment target. The first layer target is designed to have a pitch similar to that of a periodic feature of the integrated circuit, such as a capacitor. The second layer target is designed to have a pitch that minimizes displacement of the second layer target by optimizing the light diffraction patterns of the second layer target based on the first layer target.

The pitch of the second layer target is determined by several steps. First, projection lens locations of the light diffraction patterns created by the first layer target for a particular illumination setting are determined. Second, the projection lens locations of the $0^{th}$ order light diffraction pattern for the second layer illumination settings are determined. Finally, the second layer target's pitch is selected which optimizes overlap of the $1^{st}$ order light diffraction patterns of the second layer target with that of the $0^{th}$ order diffraction pattern of the first layer target. The more overlap between the respective diffraction patterns of the first and second layer targets, the more the displacement error caused by lens aberrations is reduced.

BRIEF DESCRIPTION OF THE DRAWINGS

The above issues and other advantages and features of the invention will be more readily understood from the following detailed description of the invention provided in connection with the accompanying drawings.

DETAILED DESCRIPTION OF PREFERRED EMBODIMENTS

The present invention will be described as set forth in the exemplary embodiments illustrated in FIGS. 7–16. Other embodiments may be utilized and structural and functional changes may be made without departing from the spirit or scope of the present invention.

Figure 7:
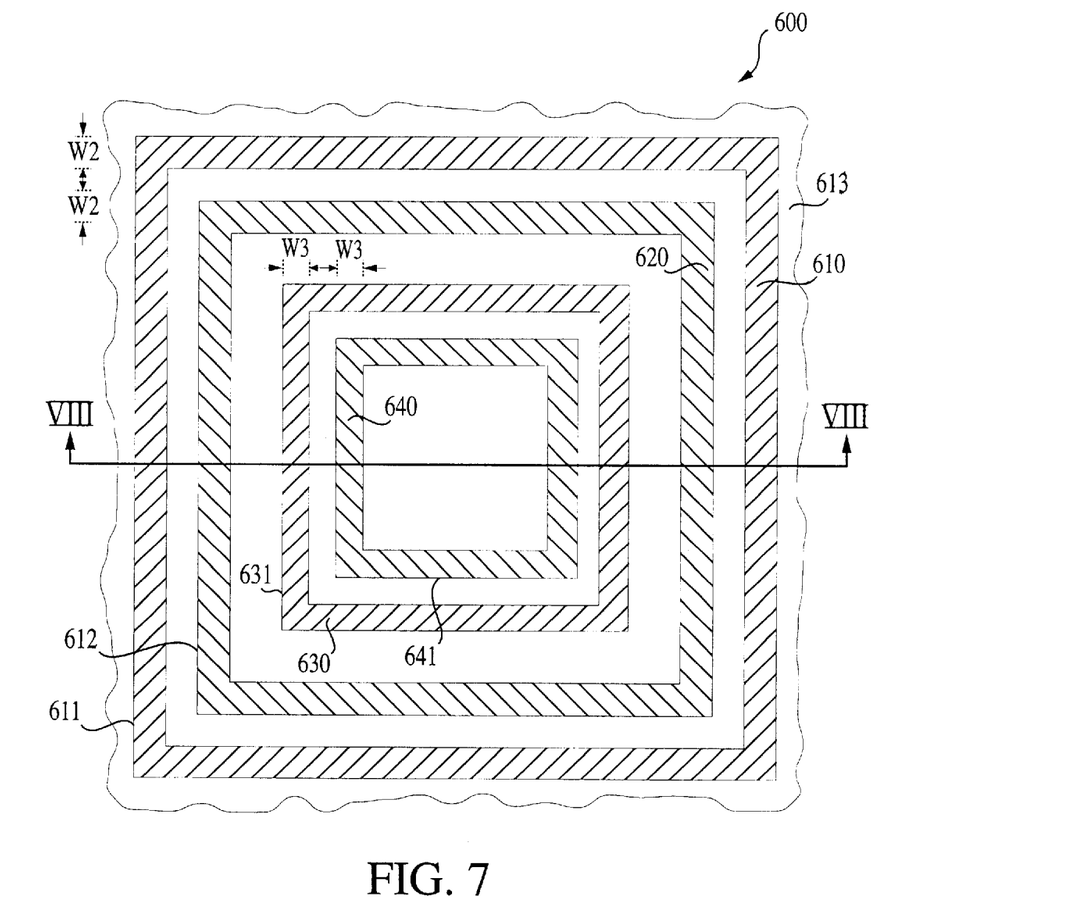
FIG. 7 is a top view of a fine pattern target system according to an exemplary embodiment of the present invention.
Figure 8:
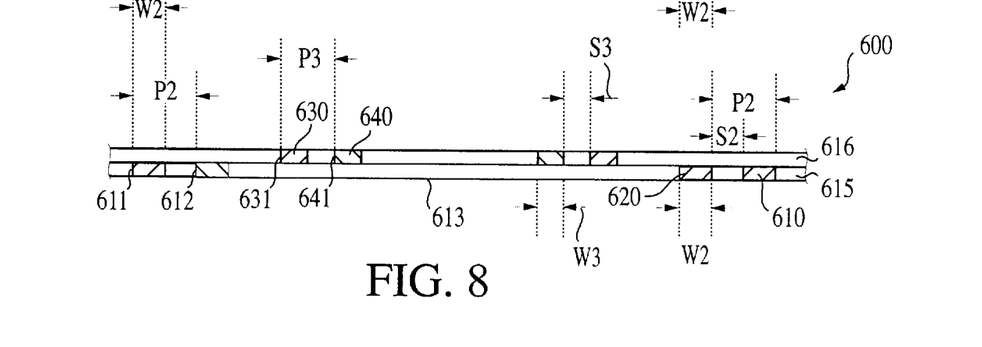
FIG. 8 is a cross-sectional view of FIG. 7 along line VIII—VIII.

FIGS. 7–8 are illustrations of an exemplary target system 600 designed according to a method of the present invention as described in regards to FIGS. 9–16. FIG. 8 is a cross-sectional view of FIG. 7 along line VIII—VIII. The fine pattern targets 610, 620 of first layer 615 are formed on layer 613. The targets 610, 620 are shown as two concentric geometric squares. It is to be understood that other shapes, number of targets, and arrangements are possible options, if so desired. The first layer targets 610, 620 are separated by distance P2, hereinafter called pitch P2. Ideally, pitch P2 should be close to the circuit's limiting dimension, such as the spacing between capacitors in a DRAM device. For example, if the minimum device dimension is 1 micron, the first layer target pitch P2 should be close to 1 micron as well.

In an exemplary embodiment, as described in FIGS. 9–16, the pitch P2 of target 610, 620, is selected at 1 micron to approximate the dimension of forming a trench in an insulating layer. The pitch P2 is the distance from the perimeter 611 of the outside first layer target 610 and the perimeter 612 of the inside first layer target 620. The pitch P2 consists of the combined distance of line width W2 and space S2. The line width W2 and space S2 are selected at 0.5 microns each. It is to be understood that the selection of P2, W2, and S2 can vary without limiting the scope of the invention.

Referring to FIG. 8, a second layer 616 is shown formed over layer 615 with second layer targets 630, 640. The pitch P3, line width w3, and space width S3 of second layer targets 630, 640 are shown. In the exemplary design method of the present invention (as discussed in FIGS. 9–16), the pitch P3 is designed to minimize lens aberrations or image displacement errors caused by projection lens 30. It is to be understood that the shape and number of fine patterns is not to be limited by the exemplary embodiment. Two concentric boxes made up of thin lines are but one of numerous configurations for alignment targets.

Figure 9:
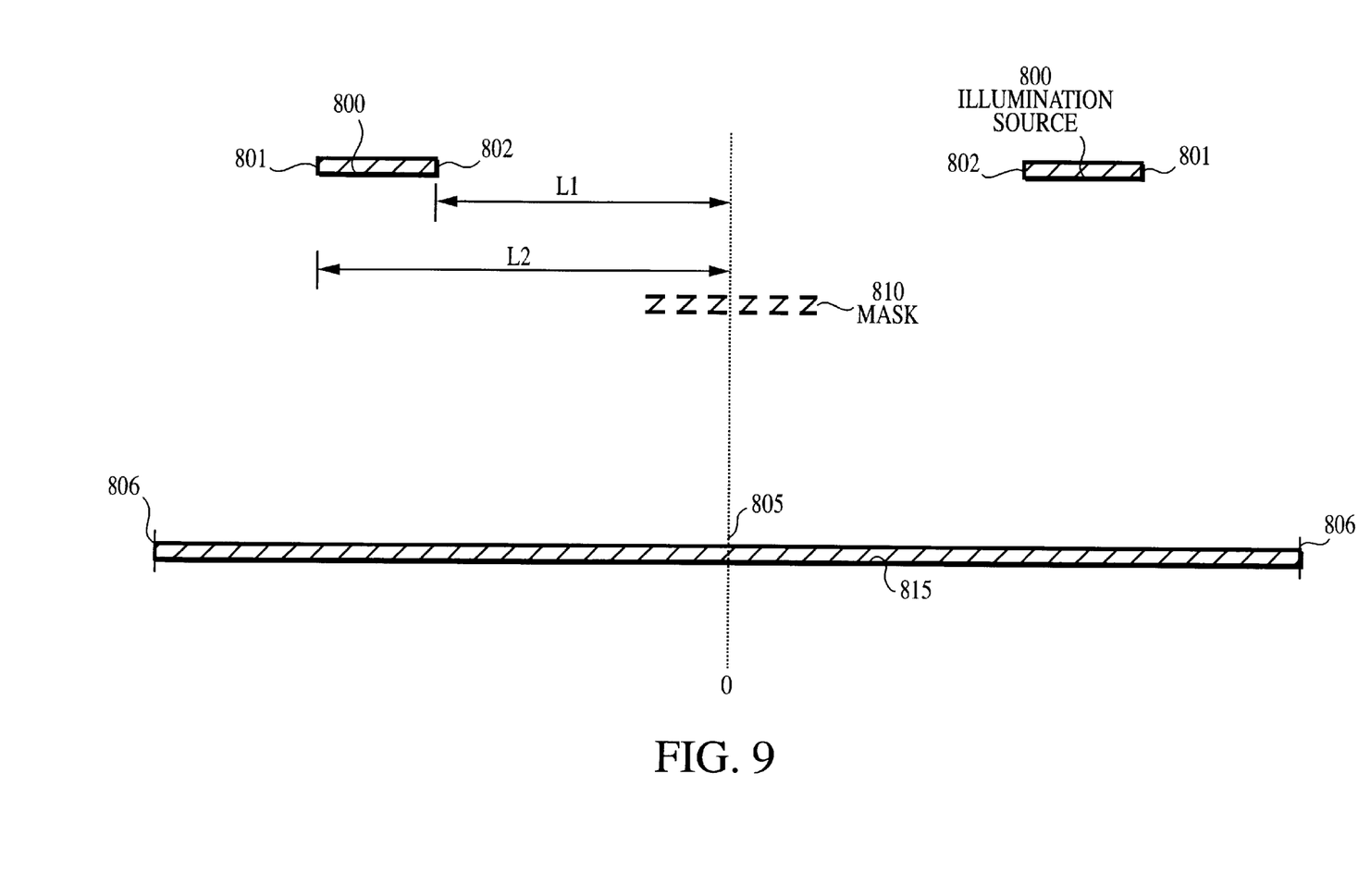
FIG. 9 is a cross-sectional illustration of an imaging system used for forming the first layer targets of FIGS. 7–8.

FIG. 9 is a cross-sectional illustration of an annular light source 800 used to transfer an image of mask 810 containing first layer targets 610, 620 of FIGS. 7–8. The light source 800 of the exemplary embodiment has a wavelength (λ2) of 248 nanometers. The outer illumination diameter 801 represented by line L2 is 0.8 numerical aperture units (N.A. units). The inner illumination diameter 802 represented by L1 is 0.5 numerical aperture units. The image of mask 810 is illuminated by light source 800 and reduced by projection lens 815 before being transferred to a wafer (not shown). The projection lens 815 has a numerical aperture 806 of 0.63 N.A. units. The lens axis 805 is shown by the center line.

Figure 10:
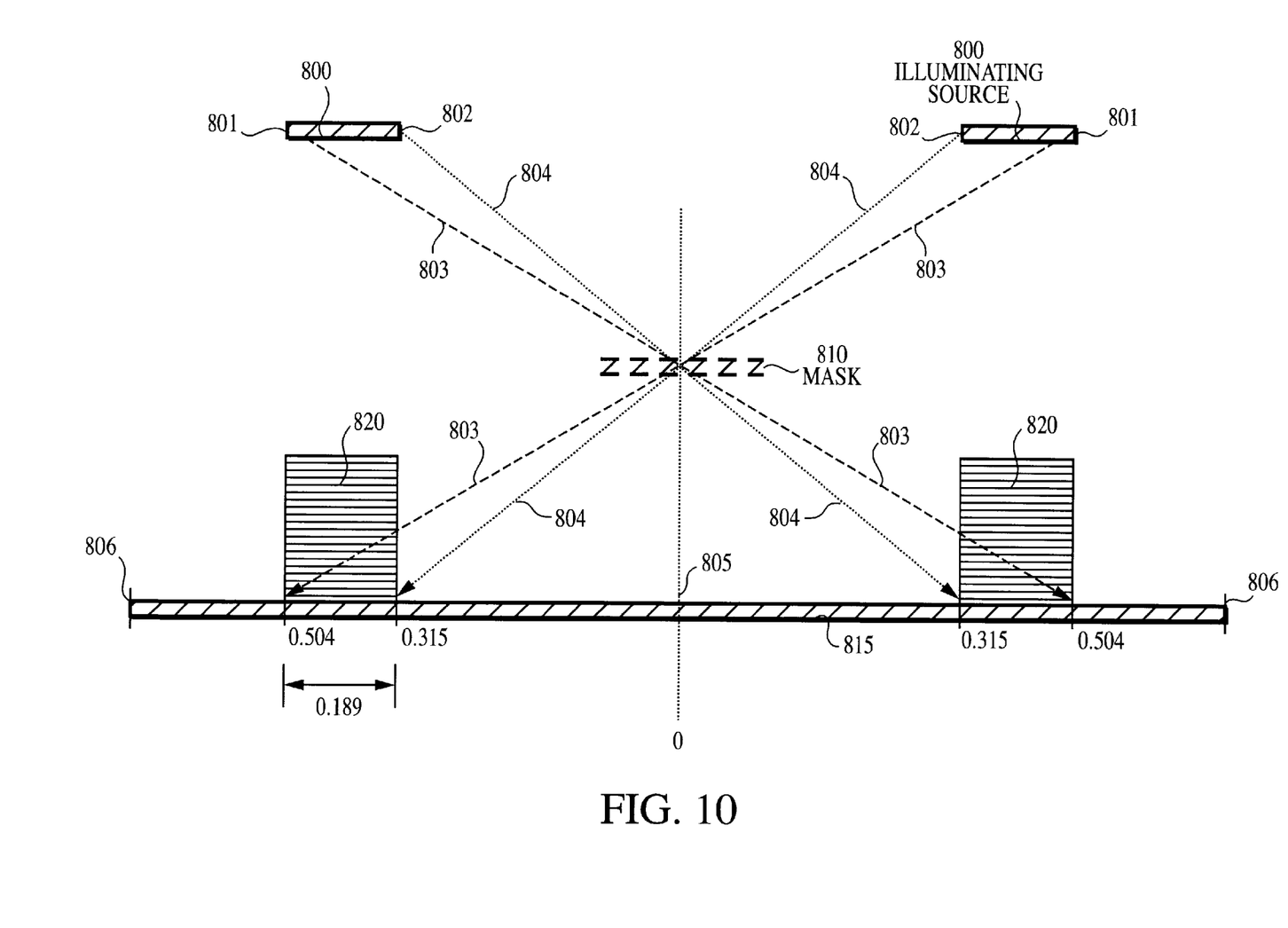
FIG. 10 is a cross-sectional illustration of the projection lens location of the $0^{th}$ order light diffraction pattern for the first layer targets of FIGS. 7–8.

FIG. 10 is a cross-sectional illustration of the projection lens 815 location of the $0^{th}$ order light diffraction patterns 820 generated by light source 800 passing through mask 810 containing first layer targets 610, 620 of FIGS. 7–8. The diffraction order locations for projection lens 800 can be determined using an imaging software, such as Sigma C, manufactured by Solid C Corporation of California, using known light diffraction equations. The location of the $0^{th}$ order region is represented by the two blocks 820. The $0^{th}$ diffraction order represent regions where light was not deviated by the first layer targets 610, 620 of mask 810. Blocks 820 are located between 0.315 and 0.501 N.A. units from the lens axis 805. The $0^{th}$ diffraction region is 0.189 N.A. units wide. The two boundaries are established by light from the outer 801 and inner 802 diameters of the light source 800 passing through mask 810. The light paths are illustrated by lines 803, 804.

Figure 11:
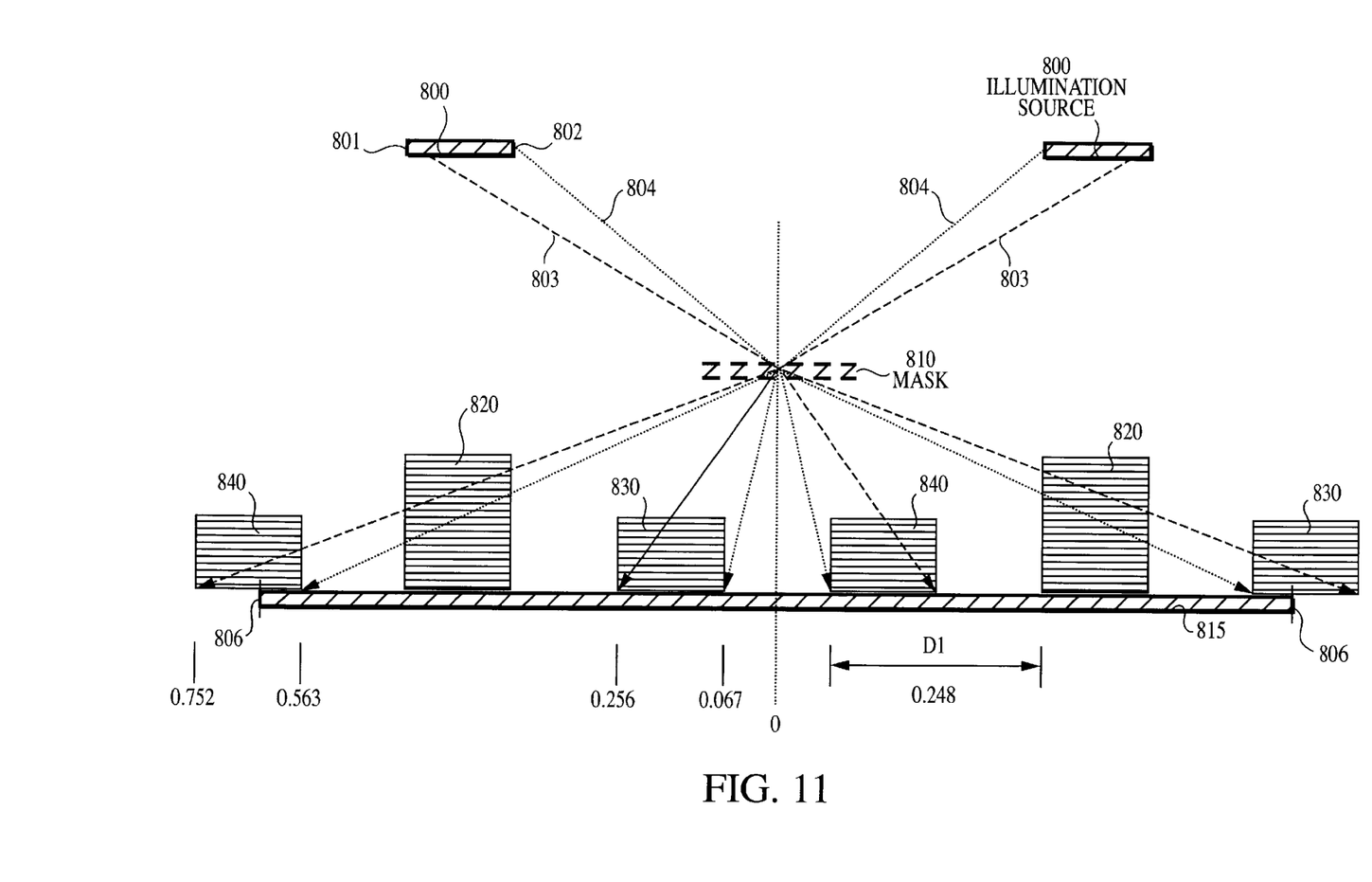
FIG. 11 is a cross-sectional illustration of the projection lens location of the −1, $0^{th}$, and $1^{st}$ light diffraction patterns for the first layer targets of FIGS. 7–8.

FIG. 11 is a cross-sectional illustration of the projection lens 805 location of the $0^{th}$ diffraction order 820, the $1^{st}$ diffraction orders 830, and the −1 diffraction orders 840 of first layer targets 610, 620 formed on mask 810. Part of the $1^{st}$ diffraction order is located between 0.067 and 0.25 6 N.A. units from the lens axis 805. Another part diffraction order is located at 0.563 and falls partially outside the lens aperture. It is to be understood that the present invention can be used to analyze any diffraction order and is not limited to the $0^{th}$ and $1^{st}$ order diffraction patterns.

The distance D1 between the boundaries of the $0^{th}$ order diffraction regions 820 and the $1^{st}$ order diffraction regions 830 is a function of the light wavelength λ2 and first layer target pitch P2. Distance D1 equals the wavelength λ2 divided by pitch P2:

$$D1 = \lambda 2/P2 \text{ or } 248 \text{ nm}/1000 \text{ nm} = 0.248 \text{ numerical aperture} \quad (1)$$

Figure 12:
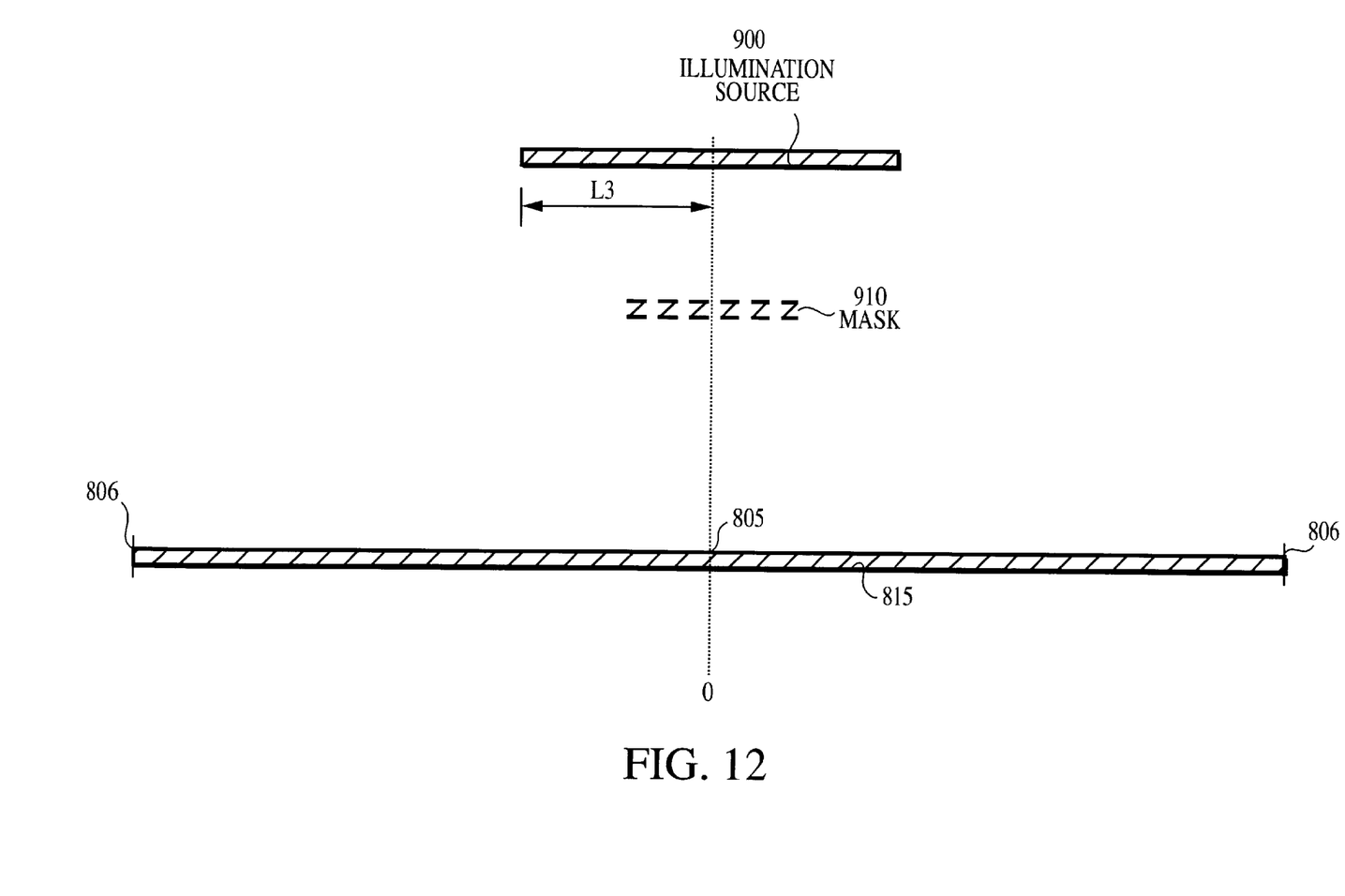
FIG. 12 is a cross-sectional illustration of an imaging system used for forming the second layer targets of FIGS. 7–8.

FIG. 12 is a cross-sectional illustration of conventional light source 900 used to transfer an image of mask 910 containing second layer targets 630, 640 of FIGS. 7–8. The light source 900 of the exemplary embodiment has a wavelength λ3 of 248 nanometers and diameter of 0.305 microns. The diameter is represented by line L3 and the light source 900 has an illumination diameter of 0.192 N.A. units. The image of mask 910 is illuminated by light source 900 and is reduced by projection lens 815 which was previously described above. Typically the same projection lens 815 is used for the first 810 and second 910 masks.

Figure 13:
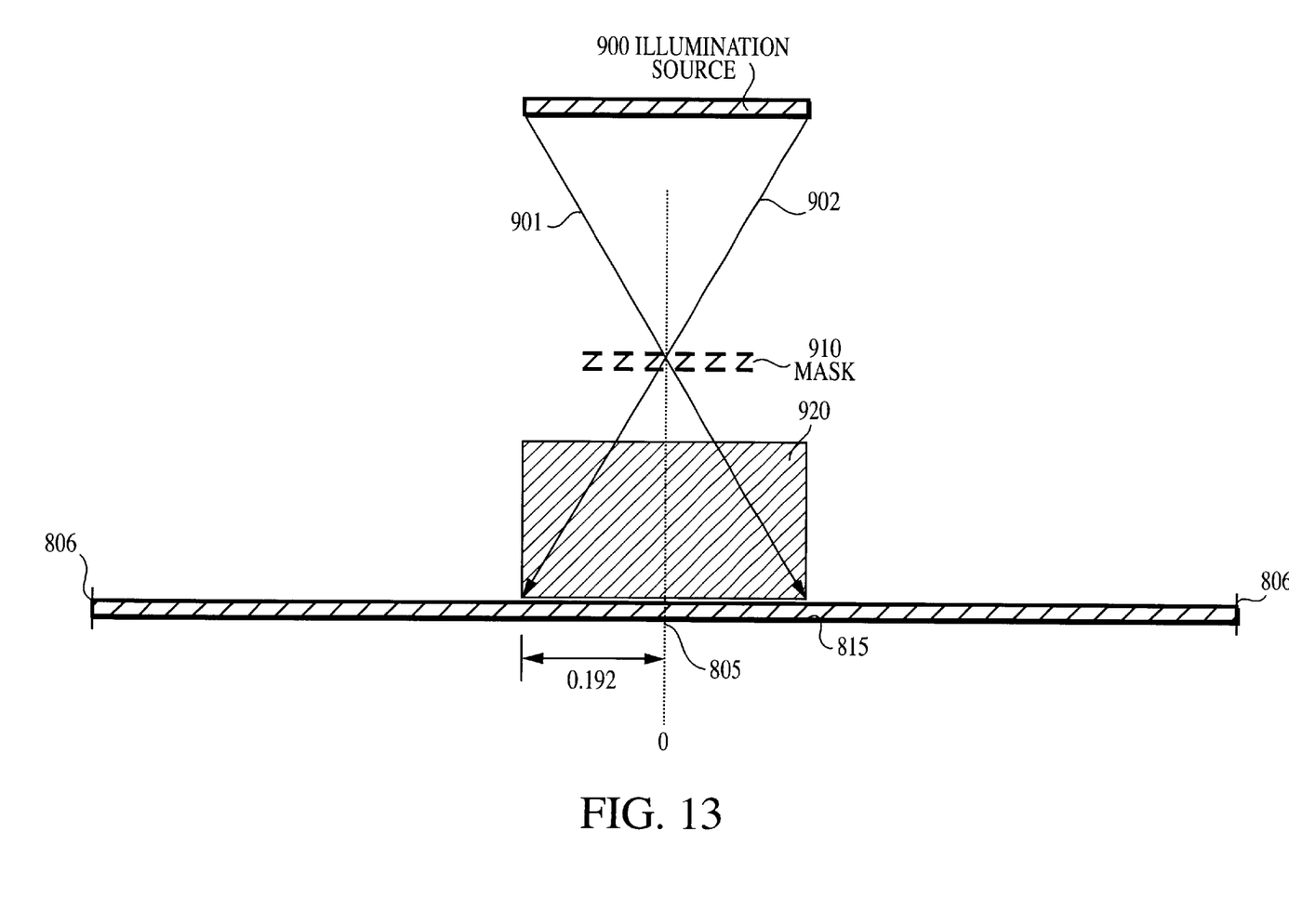
FIG. 13 a cross-sectional illustration of the projection lens location of the $0^{th}$ order light diffraction pattern for the second layer targets of FIGS. 7–8.
Figure 14:
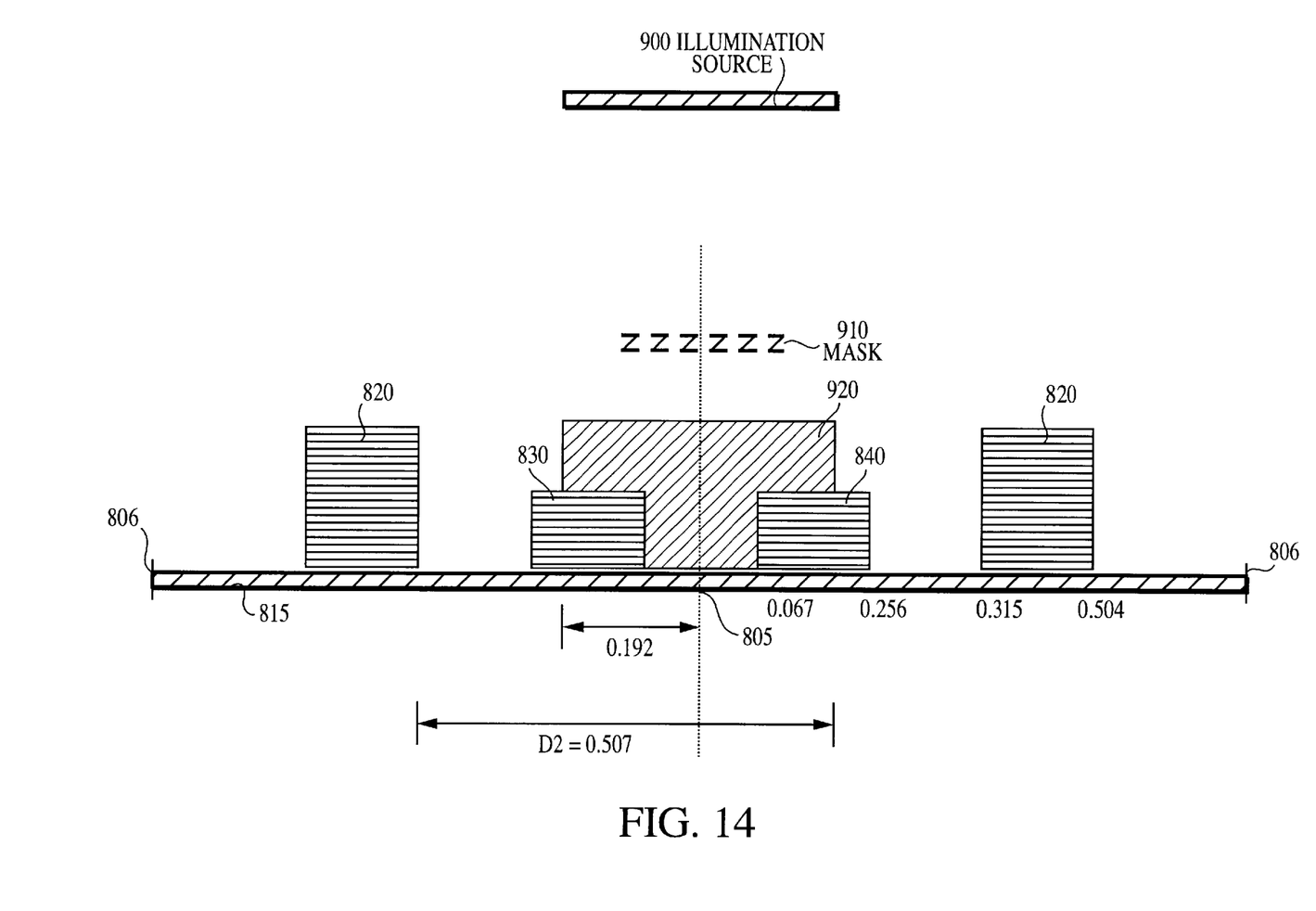
FIG. 14 is a cross-sectional illustration of the projection lens location of the −1, $0^{th}$, and $1^{st}$ light diffraction pattern for the first layer targets of FIGS. 7–8 and the $0^{th}$ light diffraction orders of the second layer targets of FIGS. 7–8.

FIG. 13 is a cross-sectional illustration of the projection lens 815 location of the $0^{th}$ order light diffraction patterns 920 generated by light source 900 passing through mask 910. The $0^{th}$ diffraction order locations for projection lens 815 can be determined as discussed previously. The location of the $0^{th}$ order region is represented by the block 920. Block 920 is between the lens axis 805 and 0.192 N.A. units from the lens axis 805. The light paths are illustrated by lines 901, 902 travel from light source 900 through mask 910 to projection lens 815. The lens location of the $0^{th}$ diffraction pattern is independent of the pitch P3 of the second layer targets 630, 640. FIG. 14 is a cross-sectional illustration of the diffraction patterns 820, 830 (FIG. 11) of first layer targets 610, 620 superimposed over the $0^{th}$ diffraction 920 pattern of the second layer light source 900 as discussed in FIG. 13. The distance D2, which equals 0.507 N.A. units, represents the distance between the $0^{th}$ diffraction orders 820, 920 of the first and second layer targets 610, 620, 630, 640.

To minimize the misalignment of the second layer targets 630, 640 with the first layer targets 610, 620, the pitch P3 of the second layer targets 630, 640 should be designed to minimize lens aberrations. An exemplary method for determining the pitch P3 for second layer targets 630, 640 based on the light diffraction patterns of the first layer targets 610, 620 is described in FIG. 15 (process segments 520, 530, 540, 550). The first segment 520 of the method 500 is to select a pitch P2 for first layer targets 610, 620. The second segment 530 is to determine the projection lens locations of the diffraction orders generated from first layer targets 610, 620 as described in FIGS. 10–11. The third segment 540 is to determine the distance D2 between the first layer targets 610, 620 $0^{th}$ diffraction orders 820 and the second layer targets 630, 640 $0^{th}$ diffraction order 920. The distance D2 can be solved using, for example, the graph in FIG. 14. The fourth segment 550 is to select a pitch P3 for the second layer targets 630. 640 so that the majority of the $1^{st}$ light diffraction order for the second layer targets 630, 640 passes through the projection lens 30 (FIG. 1) in the region where the $0^{th}$ light diffraction order for the first layer targets 610, 620 passed.

Figure 15:
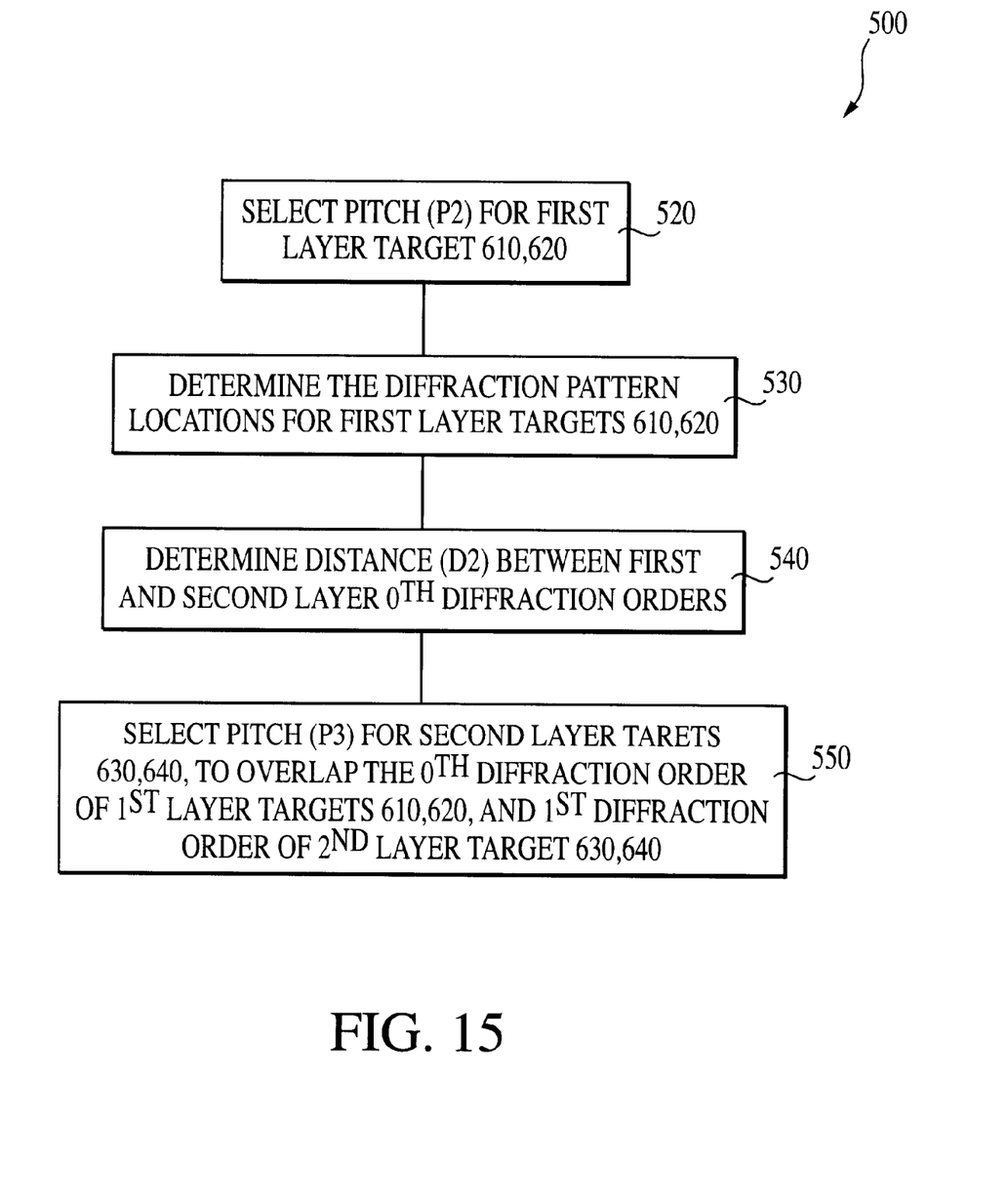
FIG. 15 is a flow chart of the design method for determining the pitch for second layer targets of FIGS. 7–8 according to the present invention.

An exemplary method is to select a pitch P3 whereby the distance D3, between the $0^{th}$ diffraction order 920 and the $1^{th}$ diffraction order 930, is equal to D2. It is to be understood that other methods could result in more optimal overlaps, the above method does not limit the scope of the invention. Other methods to include projection imaging software or trial and error methods, could be used to analyze diffraction patterns for various pitches P3 to select pitch P3 for second layer targets 630, 640, which produce a $1^{st}$ diffraction order 930 that maximizes overlap with the $0^{th}$ diffraction order 820 or the $1^{st}$ diffraction order 830 of the first layer targets 610, 620. It is to be understood that the invention is not limited to this. For example, another method is to maximize the overlap of the $0^{th}$ diffraction order 920 of the second layer 616 with the $0^{th}$ diffraction order 820 or $1^{st}$ diffraction order 830 of the first layer 615.

Figure 16:
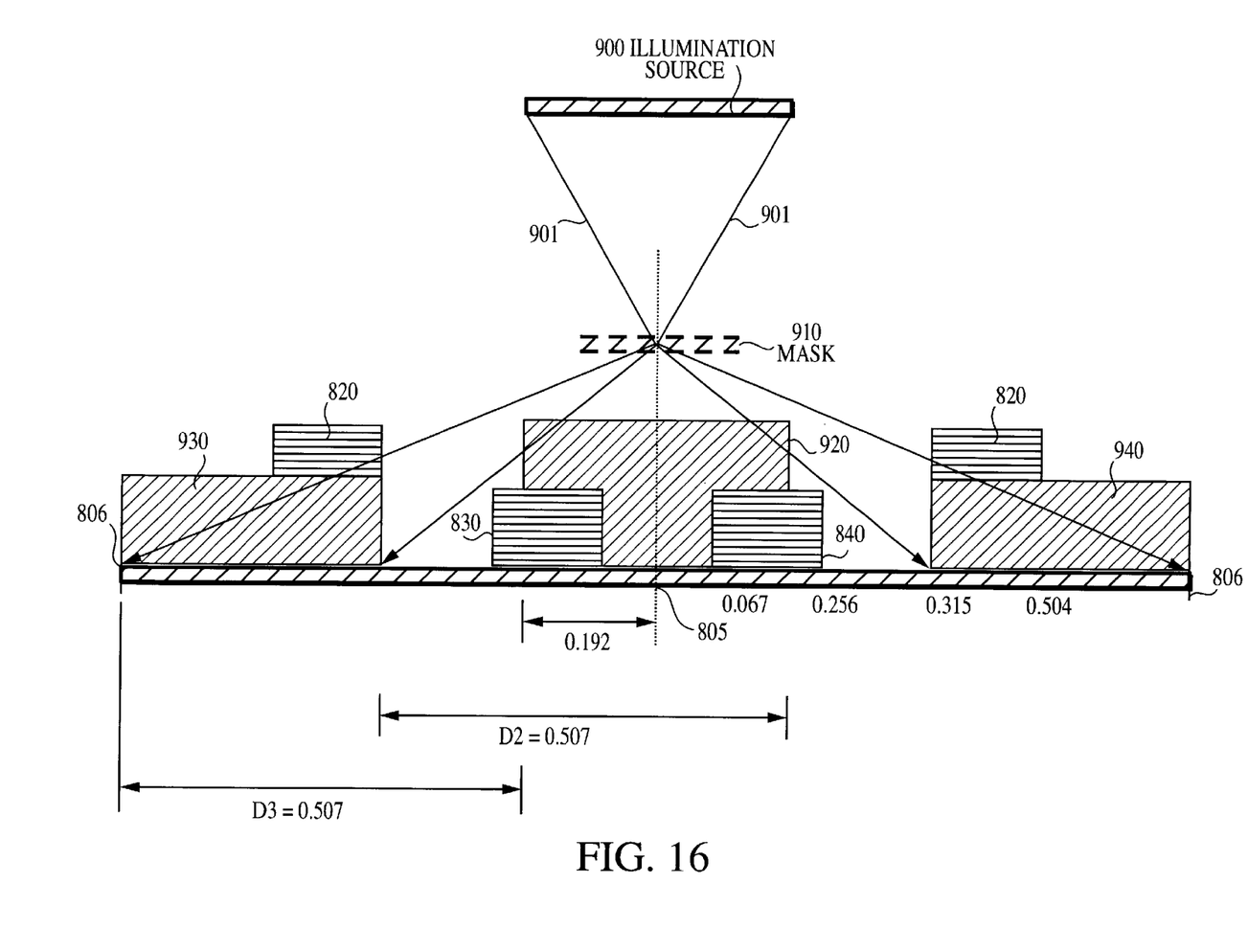
FIG. 16 is a cross-sectional illustration of the projection lens location for light diffraction patterns of the second layer targets of FIGS. 7–8 which optimize the overlap of the $1^{st}$ order diffraction pattern of the second layer target with the $0^{th}$ order diffraction pattern of the first layer target according to the method of the present invention.

FIG. 16 is a cross sectional illustration of the exemplary method of step 550 where distance D3 is selected to equal D2 which is 0.507 (FIG. 14). The first diffraction order 930 of second layer targets 630, 640 begins at 0.315 N.A. units from the lens axis 805 and extends past the lens numerical aperture 806. The distance D3 between the $0^{th}$ order diffraction pattern 920 and the $1^{st}$ order diffraction pattern 930 is 0.507 N.A. units. Thus pitch P3 of target 630, 640 can be solved using the equation:

$$P3=(\lambda 3/D3)=248 \text{ nanometers}/0.507=0.489 \text{ microns} \quad (2)$$

In most circumstances exact overlap will not be possible, so pitch P3 will be designed to minimize the amount of displacement error for a given illumination setting.

Figure 17:
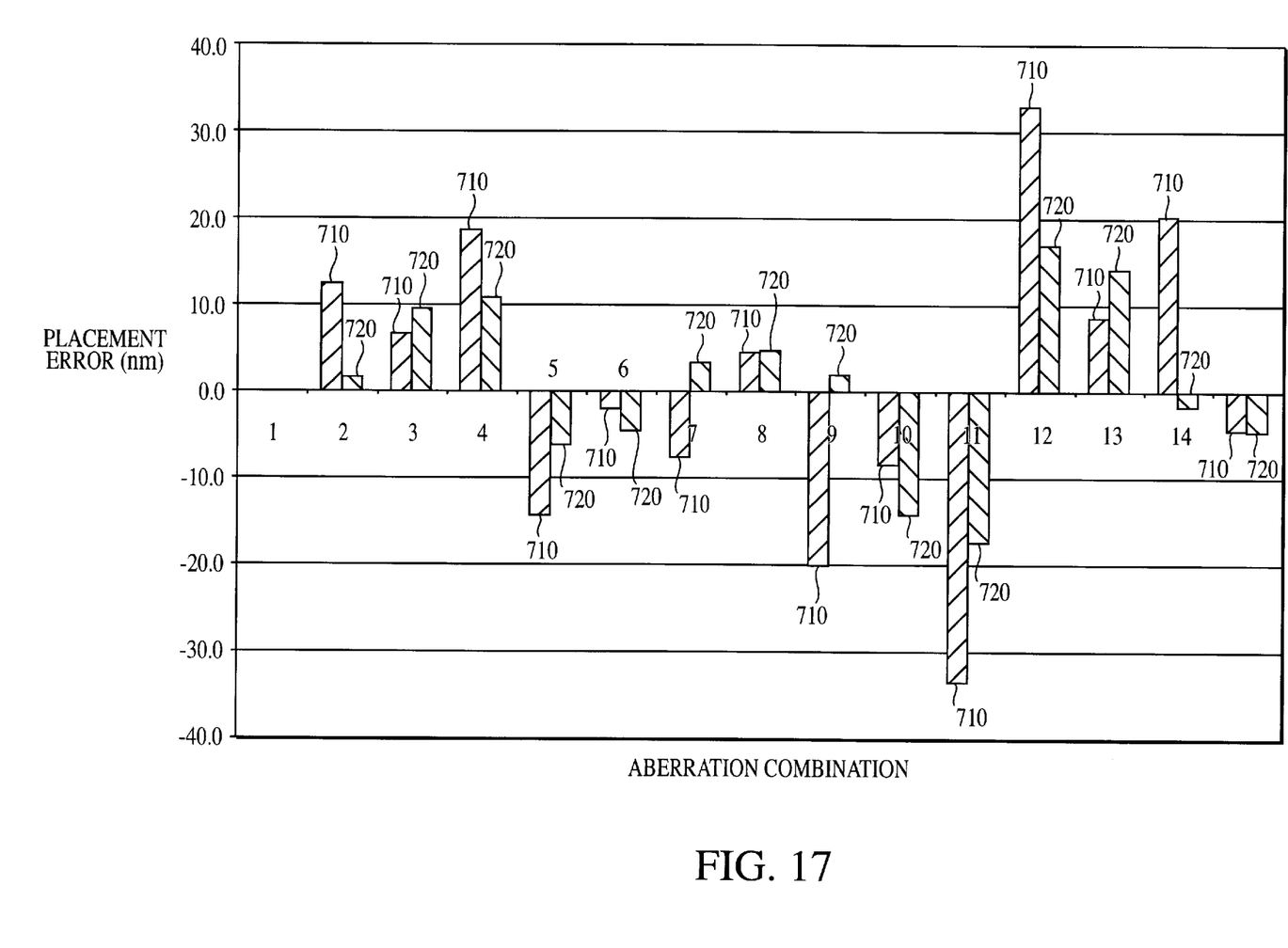
FIG. 17 is a graphical bar chart comparison of the displacement error for various combinations of aberration coefficients for a conventional fine pattern target compared to a fine pattern target designed according to a method of the present invention.

FIG. 17 is a bar graph comparison of the displacement errors generated by lens aberrations for a conventional target system 200 versus the target system 600 of the present invention. The bars labeled 710 represent the lens displacement errors for prior art target systems 200 for various combinations of light aberration coefficients. The bars labeled 720 represent the lens displacement errors for target systems 600 formed according to the present invention. The use of various aberration coefficients to determine the refracting properties of a lens are known in the art. FIG. 17 illustrates the impact that various combinations of aberration coefficients have on the displacement of the target systems 200, 600. At combinations 11 and 12 the displacement error for target system 200 exceeds 30 nanometers, while the displacement error for target system 600 was reduced by over 50%.

Having thus described in detail exemplary embodiments of the invention, it is to be understood that the invention defined by the appended claims is not to be limited by particular details set forth in the above description as many apparent variations thereof are possible without departing from the spirit or scope of the invention. Accordingly, the above description and accompanying drawings are only illustrative of exemplary embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United States is:

1. A method for determining a pitch of a target comprising the steps of:
   determining light diffraction patterns of a first layer target and
   selecting a pitch for a second layer target, wherein at least a portion of a $1^{st}$ order diffraction pattern of said second layer target overlaps at least some portion of a $0^{th}$ order diffraction pattern of said first layer target.

2. A method for determining a pitch of a second layer alignment target comprising the steps of:
   determining light diffraction patterns of a first layer alignment target generated by a first illumination setting;
   determining a $0^{th}$ order light diffraction pattern generated by a second illumination setting;
   determining a first distance between a $0^{th}$ order light diffraction of the second illumination setting and a $0^{th}$ order light diffraction pattern of the first layer alignment target; and
   determining a pitch for said second layer alignment target, wherein a second distance between the $0^{th}$ order light diffraction patterns of the second illumination setting and a $1^{st}$ order diffraction pattern for the second layer alignment target generated by said pitch equals said first distance.

3. A method of determining the pitch of a second layer feature on a mask, comprising the steps of:
   determining light diffraction patterns of a first layer feature on a mask and selecting a pitch for the second layer feature, wherein at least a $1^{st}$ order diffraction pattern of the second layer feature overlaps at least some portion of a $0^{th}$ order diffraction pattern of the first layer feature.

4. A method of determining a pitch of a second layer feature of a target comprising the steps of:
   determining a light diffraction pattern of a first layer feature for a first illumination setting;
   determining an $n^{th}$ order light diffraction pattern for a second illumination setting;
   determining a first distance between the $n^{th}$ order light diffraction for the second illumination setting and an $m^{th}$ order light diffraction pattern of the first layer feature; and
   determining a pitch for the second layer feature, wherein a second distance between the $n^{th}$ order light diffraction pattern for the second illumination setting and the $m^{th}$ order diffraction pattern for the second layer feature equals said first distance.

5. The method of claim 1, wherein at least one of said first layer and second layer targets is an alignment target.

6. The method of claim 1, wherein said at least one of said first layer and second layer targets is a fine pattern alignment targets.

7. The method of claim 1, wherein said first layer comprises at least two geometric shaped targets.

8. The method of claim 1, wherein said second layer comprises at least two geometric shaped targets.

9. The method of claim 1, wherein at least one of said first layer targets comprise two targets, wherein a second target is located inside the perimeter of the first target.

10. The method of claim 1, wherein at least one of said second layer targets comprise two targets, wherein a second target is located inside the perimeter of the first target.

11. The method of claim 1, wherein at least one of said targets comprises a photoresist.

12. The method of claim 7, wherein said geometric shapes comprise fine pattern squares.

13. The method of claim 8, wherein said geometric shapes comprise fine pattern squares.

14. A method of forming two targets on at least two different layers of a substrate, said method comprising:

forming a first layer over the substrate;

forming a first target in said first layer;

forming a second layer over said first layer; and forming a second target in said second layer, wherein a pitch of said second target is determined by:

determining light diffraction patterns of the first target and selecting the pitch for the second layer target, wherein at least a $1^{st}$ order diffraction pattern of said second target overlaps at least some portion of a $0^{th}$ order diffraction pattern of said first target.

15. The method of claim 14, wherein said targets are formed using photolithography techniques.

16. The method of claim 14, wherein said first layer is photomask.

17. The method of claim 14, wherein said second layer is a photomask.

18. A target system comprising:

a first target formed in a first layer; and a second target formed in a second layer, wherein a pitch of said second target is formed by:

determining light diffraction patterns of the first target and selecting a pitch for the second layer target and wherein at least a $1^{st}$ order diffraction pattern of said second target overlaps at least some portion of a $0^{th}$ order diffraction pattern of said first target.

19. A method for determining a pitch for a second layer target comprising the steps of:

determining the light diffraction patterns of a first layer target and selecting a pitch for said second layer target such that a predetermined order of a light diffraction pattern of said second target overlaps at least some portion of a predetermined different order light diffraction pattern of said first layer target.

* * * * *